United States Patent
Tang (10) Patent No.: US 12,356,820 B2
(45) Date of Patent: Jul. 8, 2025

(54) DISPLAY PANEL AND METHOD FOR MANUFACTURING SAME

(71) Applicant: SHENZHEN CHINA STAR OPTOELECTRONICS SEMICONDUCTOR DISPLAY TECHNOLOGY CO., LTD., Guangdong (CN)

(72) Inventor: Jia Tang, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 18/815,734

(22) Filed: Aug. 26, 2024

(65) Prior Publication Data
US 2024/0423052 A1   Dec. 19, 2024

Related U.S. Application Data

(63) Continuation of application No. 17/310,923, filed as application No. PCT/CN2021/111598 on Aug. 9, 2021, now Pat. No. 12,133,433.

(30) Foreign Application Priority Data

Jun. 23, 2021   (CN) .......................... 202110695214.5

(51) Int. Cl.
H10K 59/179     (2023.01)
G09G 3/3216     (2016.01)

(52) U.S. Cl.
CPC ......... *H10K 59/179* (2023.02); *G09G 3/3216* (2013.01)

(58) Field of Classification Search
CPC .................................................... H10K 59/179
(Continued)

(56) References Cited

U.S. PATENT DOCUMENTS

| 5,888,674 A | 3/1999 | Yang et al. | |
|---|---|---|---|
| 2013/0187153 A1* | 7/2013 | Yamazaki | H01L 29/7869 257/43 |

(Continued)

FOREIGN PATENT DOCUMENTS

| CN | 101424844 A | 5/2009 |
|---|---|---|
| CN | 102543867 A | 7/2012 |

(Continued)

OTHER PUBLICATIONS

Chinese Office Action issued in corresponding Chinese Patent Application No. 202110695214.5 dated Mar. 16, 2022, pp. 1-7.

(Continued)

*Primary Examiner* — Christopher M Raabe (57) ABSTRACT

A display panel and a method for manufacturing the display panel are provided. The method comprises forming an array driving layer, a binding terminal, a passivation layer, a covering layer and an electrode layer on a substrate, and applying a half-tone mask to perform a patterning process on the covering layer and the electrode layer, so that the covering layer forms a first covering portion connected to the binding terminal through a first through hole and a second covering portion corresponding to the array driving layer formed on the display area. The electrode layer forms a second electrode portion on the second covering portion.

9 Claims, 4 Drawing Sheets

(58) Field of Classification Search
USPC .......................................................... 313/504
See application file for complete search history.

(56) References Cited

U.S. PATENT DOCUMENTS

2016/0163880 A1* 6/2016 Ohno ................. H10D 30/6755
                                                        438/104
2017/0100489 A1* 4/2017 Xu ......................... C07K 14/78

FOREIGN PATENT DOCUMENTS

| CN | 102723269 A | 10/2012 |
| CN | 109872973 A | 6/2019 |
| CN | 112909200 A | 6/2021 |

OTHER PUBLICATIONS

Chinese Rejection Decision issued in corresponding Chinese Patent Application No. 202110695214.5 dated Sep. 26, 2022, pp. 1-4.
International Search Report in International application No. PCT/CN2021/111598, mailed on Mar. 22, 2022.
Written Opinion of the International Search Authority in International application No. PCT/CN2021/111598, mailed on Mar. 22, 2022.

* cited by examiner

DISPLAY PANEL AND METHOD FOR MANUFACTURING SAME

This application is a continuation of U.S. application Ser. No. 17/310,923, filed 31 Aug. 2021, which was the National Stage of International Application No. PCT/CN2021/111598, filed 9 Aug. 2021, which claims priority to and the benefit of CN 202110695214.5, filed 9 Aug. 2021, the entireties of which are hereby incorporated herein by reference.

FIELD OF INVENTION

This disclosure relates to a field of display technology, and more particularly, to a display panel and a method for manufacturing the display panel.

BACKGROUND OF INVENTION

Organic light emitting diode (OLED) display is a current-type organic light emitting device that emits light through the injection and recombination of carriers. It has the advantages of thinness, high brightness, low power consumption, fast response times, high luminous efficiency and satisfactory flexibility, and can meet the new requirements of consumers for different displaying forms. More and more panel manufacturers around the world have invested much effort of research and development in this, which has greatly promoted the industrialization process of OLEDs.

At present, in order to reduce wiring impedance of a large-size OLED display panel, copper is usually used as the material of wiring and binding terminals. However, the stability of copper is poor, and is easily oxidized when directly exposed to the external environment, resulting in poor binding. In order to solve this problem, for the bottom light-emitting OLED display panel, the binding terminals are usually covered by the same material as an anode layer for protecting the binding terminal. For top light-emitting OLED display panels, the anode layer is usually a composite film layer of a reflective metal layer and a transparent conductive film layer. An etching solution used to etch the reflective metal layer can cause severe corrosion to copper. Moreover, the stability of silver or aluminum, which is often used as the reflective metal layer, is also poor and cannot meet the reliability requirements of the bonding terminals. Therefore, it is necessary to add a photomask to form a cover layer to protect the binding terminals, thereby increasing the manufacturing costs of the display panel and reducing the manufacturing efficiency.

SUMMARY OF INVENTION

Technical Problem

The disclosure provides a display panel and a manufacturing method thereof. The method for manufacturing the display panel can reduce the quantity of photomasks used in the manufacturing process, so that the manufacturing efficiency of the display panel is improved and the manufacturing costs are reduced.

Technical Solutions

In order to solve the above-mentioned drawbacks, the first aspect of the disclosure is to provide a method for manufacturing a display panel, which comprises the following steps:

a step S10 of providing a substrate and forming an array driving layer and a binding terminal on the substrate, wherein the array driving layer is correspondingly formed in a display area, and the binding terminal is correspondingly formed in a non-display area;

a step S20 of forming a passivation layer on the array driving layer and the bonding terminal and forming a first through hole in the passivation layer, wherein the first through hole exposes the bonding terminal;

a step S30 of forming a covering layer on the passivation layer;

a step S40 of forming an electrode layer on the covering layer; and a step S50 of applying a half-tone mask to perform a patterning process on the covering layer and the electrode layer, so that the covering layer forms a first covering portion and a second covering portion, wherein the first covering portion is connected to the binding terminal through the first through hole, the second covering portion is correspondingly disposed on the array driving layer, a second electrode portion is formed by the electrode layer, and the second electrode portion is correspondingly formed on the second covering portion.

In the method for manufacturing a display panel provided by the embodiment of the disclosure, the step S50 further comprises steps of:

a step S501 of forming a photoresist layer on the electrode layer, and using the half-tone mask to expose and develop the photoresist layer, so that the photoresist layer is patterned to form a first photoresist portion and a second photoresist portion, wherein the first photoresist portion is correspondingly disposed on the binding terminal, and the second photoresist portion is correspondingly disposed on the array driving layer, and a thickness of the first photoresist portion is less than a thickness of the second photoresist portion;

a step S502 of etching the electrode layer first under shielding of the first photoresist and the second photoresist, so that the electrode layer forms a first electrode portion corresponding to the first photoresist portion and a second electrode portion corresponding to the second photoresist portion, and then etching the covering layer, so that the covering layer forms a first covering portion corresponding to the first photoresist portion and a second covering portion corresponding to the second photoresist portion, wherein the first covering portion is connected to the binding terminal through the first through hole, and the second covering portion is correspondingly disposed on the array driving layer;

a step S503 of performing an ashing treatment on the first photoresist portion and the second photoresist portion, so that the first photoresist part is completely removed, and the second photoresist portion is thinned to form a third photoresist portion;

a step S504 of etching and removing the first electrode portion; and a step S505 of peeling off the third photoresist portion.

In the method for manufacturing a display panel provided by the embodiment of the disclosure, in step s502, the electrode layer is etched by a wet etching process, and the covering layer is etched by a dry etching process.

In the method for manufacturing a display panel provided by the embodiment of the disclosure, in the step S20, an orthographic projection of the first through hole projected on the substrate is within an orthographic projection of the binding terminal projected on the substrate.

In the method for manufacturing a display panel provided by the embodiment of the disclosure, in step S50, the first covering portion covers a side wall of the first through hole and extends to a surface of the passivation layer.

In the method for manufacturing a display panel provided by the embodiment of the disclosure, the step S30 further comprises steps of:
- a step S301 of forming a planarization layer on the passivation layer, wherein the planarization layer is disposed in the display area; and
- a step S302 of forming the covering layer on the passivation layer and the planarization layer.

In the method for manufacturing a display panel provided by the embodiment of the disclosure, in the step S10, the step of forming the array driving layer further comprises: sequentially forming an active layer, a gate insulating layer, a gate layer, an interlayer insulating layer, and a source and drain electrode layer;
  wherein a second through hole corresponding to the source and drain electrode layer is formed in the passivation layer and the planarization layer, and the second covering portion is disposed on the planarization layer and electrically connected to the source and drain electrode layer through the second through hole.

In the method for manufacturing a display panel provided by the embodiment of the disclosure, the source and drain electrode layers and the bonding terminal are formed in a same layer.

Accordingly, the disclosure further provides a method for manufacturing a display panel, which comprises the following steps:
- a step S10 of providing a substrate and forming an array driving layer and a binding terminal on the substrate, wherein the array driving layer is correspondingly formed in a display area, and the binding terminal is correspondingly formed in a non-display area;
- a step S20 of forming a passivation layer on the array driving layer and the bonding terminal and forming a first through hole in the passivation layer, wherein the first through hole exposes the bonding terminal;
- a step S30 of forming a planarization layer on the passivation layer, wherein the planarization layer is disposed in the display area, and forming the covering layer on the passivation layer and the planarization layer;
- a step S40 of forming an electrode layer on the covering layer; and
- a step S50 of applying a half-tone mask to perform a patterning process on the covering layer and the electrode layer, so that the covering layer forms a first covering portion and a second covering portion, wherein the first covering portion is connected to the binding terminal through the first through hole, the second covering portion is correspondingly disposed on the array driving layer, a second electrode portion is formed by the electrode layer, and the second electrode portion is correspondingly formed on the second covering portion.

In the method for manufacturing a display panel provided by the embodiment of the disclosure, the step S50 further comprises steps of:
- a step S501 of forming a photoresist layer on the electrode layer, and using the half-tone mask to expose and develop the photoresist layer, so that the photoresist layer is patterned to form a first photoresist portion and a second photoresist portion, wherein the first photoresist portion is correspondingly disposed on the binding terminal, and the second photoresist part is correspondingly disposed on the array driving layer, and a thickness of the first photoresist portion is less than a thickness of the second photoresist portion;
- a step S502 of etching the electrode layer first under shielding of the first photoresist and the second photoresist, so that the electrode layer forms a first electrode portion corresponding to the first photoresist portion and a second electrode portion corresponding to the second photoresist portion, and then etching the covering layer, so that the covering layer forms a first covering portion corresponding to the first photoresist portion and a second covering portion corresponding to the second photoresist portion, wherein the first covering portion is connected to the binding terminal through the first through hole, and the second covering portion is correspondingly disposed on the array driving layer;
- a step S503 of performing a ashing treatment on the first photoresist portion and the second photoresist portion, so that the first photoresist part is completely removed, and the second photoresist portion is thinned to form a third photoresist portion;
- a step S504 of etching and removing the first electrode portion; and
- a step S505 of peeling off the third photoresist portion.

In the method for manufacturing a display panel provided by the embodiment of the disclosure, in step s502, the electrode layer is etched by a wet etching process, and the covering layer is etched by a dry etching process.

In the method for manufacturing a display panel provided by the embodiment of the disclosure, in the step S20, an orthographic projection of the first through hole projected on the substrate is within an orthographic projection of the binding terminal projected on the substrate.

In the method for manufacturing a display panel provided by the embodiment of the disclosure, in step S50, the first covering portion covers a side wall of the first through hole and extends to a surface of the passivation layer.

In the method for manufacturing a display panel provided by the embodiment of the disclosure, in the step S10, the step of forming the array driving layer further comprises: sequentially forming an active layer, a gate insulating layer, a gate layer, an interlayer insulating layer, and a source and drain electrode layer;
  wherein a second through hole corresponding to the source and drain electrode layer is formed in the passivation layer and the planarization layer, and the second covering portion is disposed on the planarization layer and electrically connected to the source and drain electrode layer through the second through hole.

In the method for manufacturing a display panel provided by the embodiment of the disclosure, the source and drain electrode layers and the bonding terminal are formed in a same layer.

In the method for manufacturing a display panel provided by the embodiment of the disclosure, a material of the covering layer comprises molybdenum titanium alloy or titanium.

The second aspect of the disclosure is to provide a display panel. The display panel comprises a display area and a non-display area adjacent to the display area. The display panel further comprises:
- a substrate;
- an array driving layer disposed on the substrate and located in the display area;

a binding terminal disposed on the substrate and located in the non-display area;

a passivation layer disposed on the array driving layer and the binding terminal, wherein the passivation layer comprises a first through hole to expose the binding terminal;

a covering layer disposed on the passivation layer, wherein the covering layer comprises a first covering portion and a second covering portion, the first covering portion is disposed on the passivation layer and connected to the binding terminal through the first through hole, and the second covering portion is disposed on the array driving layer; and an electrode layer disposed on the covering layer, wherein the electrode layer comprises a second electrode portion disposed on the second covering portion.

Beneficial Effects

Compared with the conventional technology, the disclosure provides a display panel and a method for manufacturing the display panel. The method comprises steps of: a step S10 of providing a substrate and forming an array driving layer and a binding terminal on the substrate, wherein the array driving layer is correspondingly formed in a display area, and the binding terminal is correspondingly formed in a non-display area; a step S20 of forming a passivation layer on the array driving layer and the bonding terminal and forming a first through hole in the passivation layer, and wherein the first through hole exposes the bonding terminal; a step S30 of forming a covering layer on the passivation layer; a step S40 of forming an electrode layer on the covering layer; and a step S50 of applying a half-tone mask to perform a patterning process on the covering layer and the electrode layer, so that the covering layer forms a first covering portion and a second covering portion, wherein the first covering portion is connected to the binding terminal through the first through hole, the second covering portion is correspondingly disposed on the array driving layer, a second electrode portion is formed by the electrode layer, and the second electrode portion is correspondingly formed on the second covering portion. In the method, a covering layer with improved stability is formed on the binding terminal, and the covering layer and the electrode layer on the covering layer are patterned through a single exposure process using half-tone mask technology to form a corresponding covering portion to cover the binding terminal. Thus, the reliability of the binding terminal is improved. Compared with the conventional technology, the method for manufacturing the display panel has the advantages of reducing the quantity of photomasks, simplifying the process, lowering cost, and being suitable for large-scale mass production.

DESCRIPTION OF DRAWINGS

In order to more clearly illustrate the embodiments of the disclosure or the technical solutions in the prior art, the following briefly introduces the accompanying drawings used in the embodiments. Obviously, the drawings in the following description merely show some of the embodiments of the disclosure. As regards one of ordinary skill in the art, other drawings can be obtained in accordance with these accompanying drawings without making creative efforts.

DETAILED DESCRIPTION OF PREFERRED EMBODIMENTS

The technical solutions in the embodiments of the disclosure will be described clearly and completely below with reference to the drawings in the embodiments of the disclosure. Obviously, the described embodiments are only a part of the embodiments of the disclosure, but not all the embodiments. Based on the embodiments in the disclosure, all other embodiments obtained by those skilled in the art without creative efforts fall within the scope of the disclosure.

In the description of this disclosure, it should be understood that the terms "center", "longitudinal", "transverse", "length", "width", "thickness", "upper", "lower", "front", "back", "left", "right", "vertical", "horizontal", "top", "bottom", "inner", "outer" etc. for indicating orientation or positional relationship are based on the orientation or positional relationship shown in the drawings. The above-mentioned terms are only for the convenience of describing the disclosure and for simplifying the description, rather than indicating or implying that the device or element referred to must have a specific orientation, be constructed and operated in a specific orientation. Therefore, it cannot be understood as a limitation to this disclosure. In addition, the terms "first" and "second" are used for description purposes only, and cannot be understood as indicating or implying relative importance or implicitly indicating the disclosed number of technical features. Thus, features defined as "first" and "second" may explicitly or implicitly include one or more of the features. In the description of this disclosure, the meaning of "plurality" is two or more, unless otherwise specifically limited.

In this disclosure, the term "exemplary" is used to mean "used as an example, illustration, or description." Any embodiment described as "exemplary" in this disclosure is not necessarily to be construed as more preferred or advantageous than other embodiments. In order to enable any person skilled in the art to implement and use this disclosure, the following description is provided. In the following description, details are described for explanatory purposes. It should be understood that those of ordinary skill in the art may recognize that the disclosure can be implemented without using these specific details. In other examples, well-known structures and processes will not be elaborated in detail in order to avoid unnecessary details that obscure the description of the disclosure. Therefore, this disclosure is not intended to be limited to the illustrated embodiments, but is consistent with the widest scope consistent with the principles and features disclosed in this disclosure.

Figure 1:
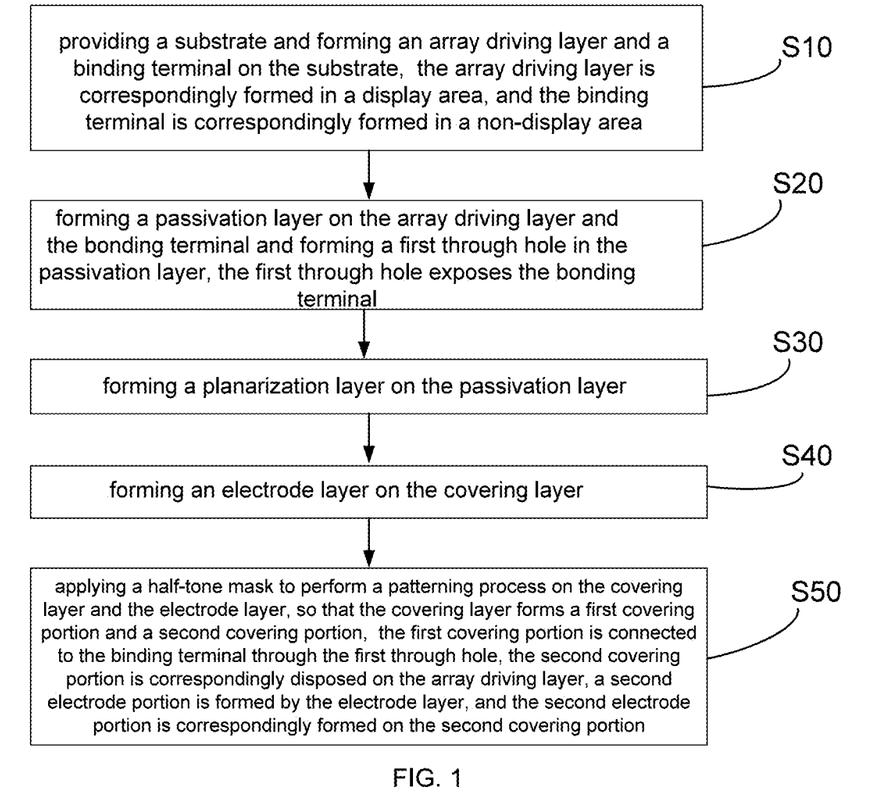
FIG. 1 is a schematic flowchart of a method for manufacturing a display panel provided by an embodiment of the disclosure.

The embodiment of the disclosure provides a method for manufacturing a display panel, which will be described in detail below with reference to the schematic flowchart the manufacturing method shown in FIG. 1 and the schematic diagram of each process of the method for manufacturing the display panel shown in FIG. 2a-FIG. 2j. Embodiments of the disclosure provide a method for manufacturing a display panel includes following steps.

In a step S10, providing a substrate 110 and forming an array driving layer 120 and a bonding terminal 130 on the substrate 110. The array driving layer 120 is correspondingly formed in a display area A1, and the bonding terminal 130 is correspondingly formed in a non-display area A2.

In a step S20, forming a passivation layer 140 on the array driving layer 120 and the bonding terminal 130 and forming a first through hole H1 in the passivation layer 140. The first through hole H1 exposes the bonding terminal 130.

In a step S30, forming a covering layer 160 on the passivation layer 140.

In a step S40, forming an electrode layer 170 on the covering layer 160.

In a step S50, applying a half-tone mask to perform a patterning process on the covering layer 160 and the electrode layer 170, so that the covering layer 160 forms a first covering portion 161 and a second covering portion 162. The first covering portion 161 is connected to the bonding terminal 130 through the first through hole H1, the second covering portion 162 is correspondingly disposed on the array driving layer 120, a second electrode portion 172 is formed by the electrode layer 170, and the second electrode portion 172 is correspondingly formed on the second covering portion 162.

Specifically, the method for manufacturing the display panel in the disclosure is described in detail below in combination with the embodiments. The method for manufacturing the display panel comprises the following steps.

Figure 2A:
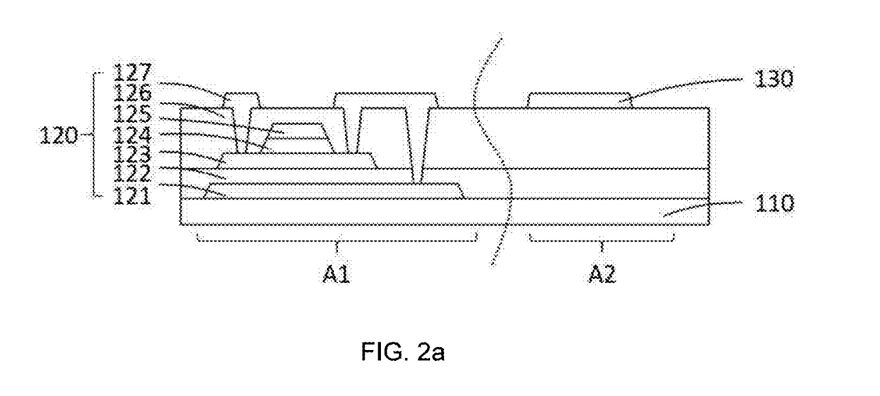
FIG. 2a-FIG. 2j are schematic diagrams of each process of the method for manufacturing the display panel provided by the embodiment of the disclosure.

In a step S10, providing a substrate 110 and forming an array driving layer 120 and a bonding terminal 130 on the substrate 110. The array driving layer 120 is correspondingly formed in a display area A1, and the binding terminal 130 is correspondingly formed in a non-display area A2. That is, a structure shown in FIG. 2a is formed. Generally, the non-display area A2 is arranged on a side of the display area A1. The specific positional relationship is shown, which should be easily understood by those skilled in the art.

In addition, the array driving layer 120 usually includes a plurality of thin film transistors arranged in an array to realize driving display. A specific structure of the array driving layer 120 is exemplified, but not limited thereto, as follows.

The array driving layer 120 includes a light shielding layer 121, a buffer layer 122, an active layer 123, a gate insulating layer 124, a gate layer 125, an interlayer insulating layer 126, and a source and drain electrode layer 127.

The light shielding layer 121 is disposed on the substrate 110, and the light shielding layer 121 is made of a metal material that does not transmit light.

The buffer layer 122 is disposed on the light shielding layer 121, and the buffer layer 122 is made of an insulating material, usually a silicon oxide film, a silicon nitride film, or a laminated film layer composed of the silicon oxide film and the silicon nitride film.

The active layer 123 is disposed on the buffer layer 122 and is corresponding to the light shielding layer 121. A material of the active layer 123 is usually selected from amorphous silicon, low-temperature polysilicon or metal oxide semiconductor materials. An orthographic projection of the active layer 123 on the substrate 110 is within an orthographic projection of the light shielding layer 121 on the substrate 110. Thus, the light is prevented from being irradiated on the active layer 123 from a side of the light shielding layer 121, which further prevents the phenomenon that the active layer 123 affects electrical properties due to the light irradiation.

The gate insulating layer 124 is disposed on the active layer 123, and the gate insulating layer 124 is made of an insulating material, usually a silicon oxide film, a silicon nitride film, or a laminated film layer composed of the silicon oxide film and the silicon nitride film.

The gate layer 125 is disposed on the gate insulating layer 124.

The interlayer insulating layer 126 is disposed on the gate layer 125, and the interlayer insulating layer is respectively formed with a first contact hole and a second contact hole at positions corresponding to both sides of the active layer 123. The first contact hole and the second contact hole expose the active layer 123.

The source and drain electrode layer 127 is disposed on the interlayer insulating layer 126 and includes a source electrode and a drain electrode. The source electrode is overlapped by the active layer 123 through the first contact hole in the interlayer insulating layer 126, and the drain electrode is overlapped by the active layer 123 through the second contact hole in the interlayer insulating layer 126.

Besides, the array driving layer 120 further includes a third contact hole formed in the interlayer insulating layer 126 and the buffer layer 122, and the drain electrode is overlapped by the light shielding layer 121 through the third contact hole.

Preferably, the bonding terminal 130 and the source and drain electrode layer 127 are formed by a same film forming process, so that the bonding terminal 130 is formed on the interlayer insulating layer 126.

Figure 2B:
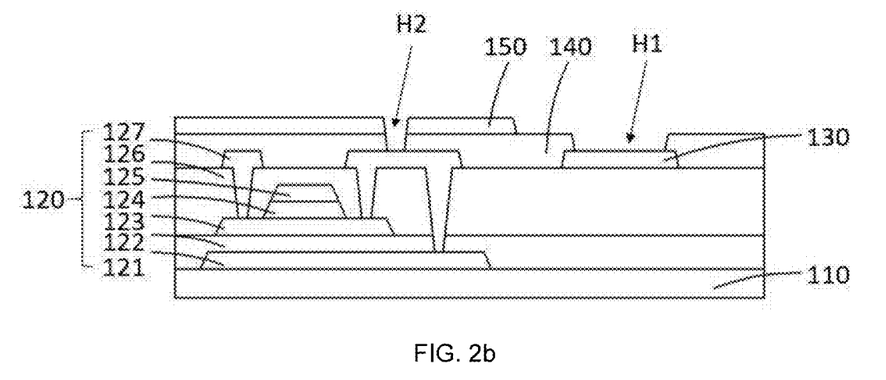

In a step S20, forming a passivation layer 140 on the array driving layer 120 and the bonding terminal 130 and forming a first through hole H1 in the passivation layer 140. The first through hole H1 exposes the bonding terminal 130. That is, a structure shown in FIG. 2b is formed. The passivation layer 140 is made of an insulating material, usually a silicon oxide film, a silicon nitride film, or a laminated film layer composed of the silicon oxide film and the silicon nitride film.

Meanwhile, a planarization layer 150 is usually formed on the passivation layer 140 at a position corresponding to the display area A1 to provide a flat surface for light-emitting devices disposed thereon. The planarization layer 150 is usually made of organic materials, and the passivation layer 140 and the planarization layer 150 are formed with a second through hole H2 at a position corresponding to the drain electrode of the source and drain electrode layer 127 to electrically connect the drain electrode to the light emitting devices.

Figure 2C:
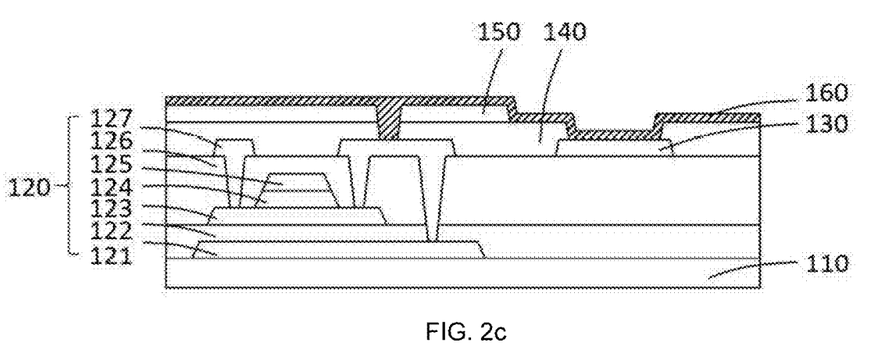

In a step S30, forming a covering layer 160 on the passivation layer 140 and the planarization layer 150. That is, a structure as shown in FIG. 2c is formed. The covering layer 160 is electrically connected to the bonding terminal 130 and the drain electrode in the array driving layer 120 through the first through hole H1 and the second through hole H2, respectively. The covering layer 160 is a film layer formed by a sputtering process, such as a physical vapor deposition process, and a material of the covering layer is usually a conductive material with more stable chemical properties.

Figure 2D:
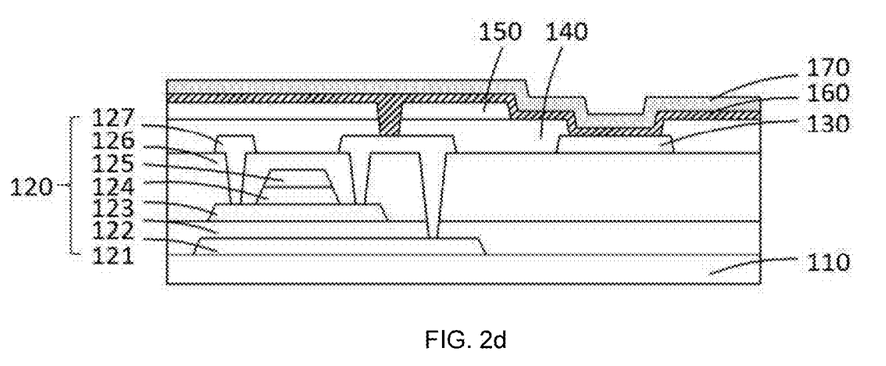

In a step S40, forming an electrode layer 170 on the covering layer 160. That is, a structure shown in FIG. 2d is formed. The electrode layer 170 is a film layer formed by a sputtering process, such as a physical vapor deposition process, which is usually a laminated structure of a reflective layer and a transparent conductive layer, such as a laminated structure of a silver layer and an indium tin oxide layer.

In a step S50, applying a half-tone mask to perform a patterning process on the covering layer 160 and the electrode layer 170, so that the covering layer 160 forms a first covering portion 161 and a second covering portion 162.

Figure 2E:
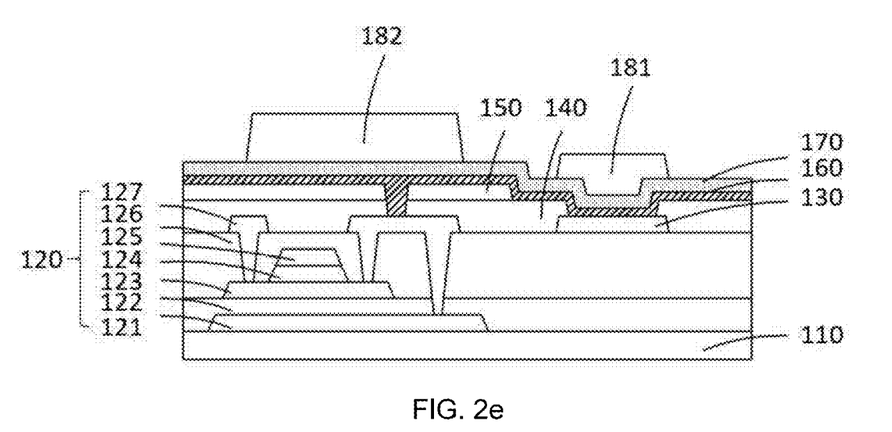
Figure 2F:
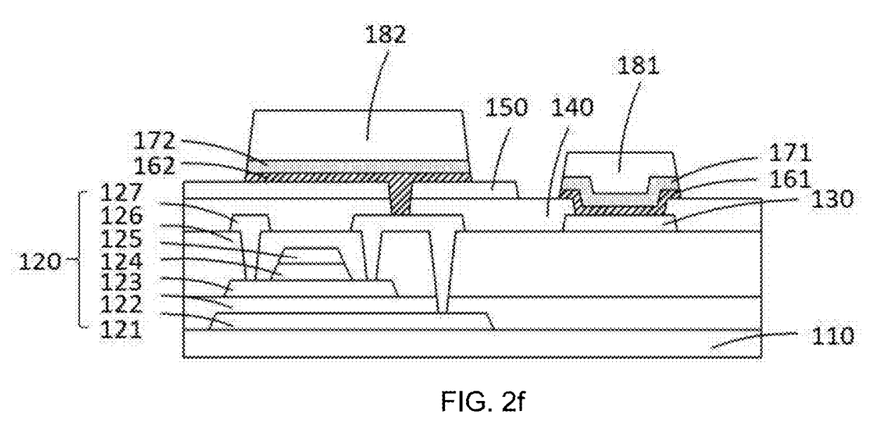
Figure 2G:
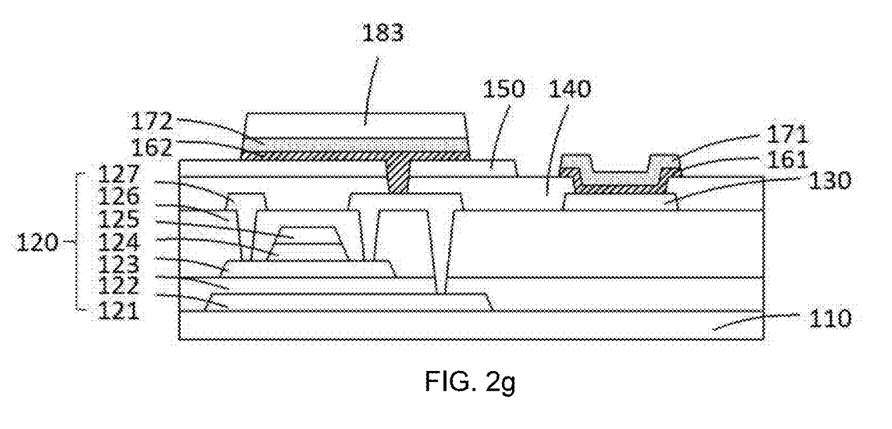
Figure 2H:
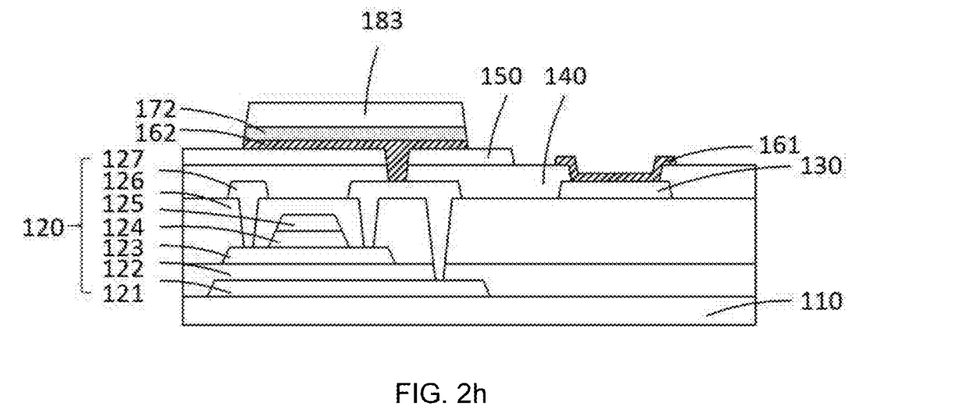
Figure 2I:
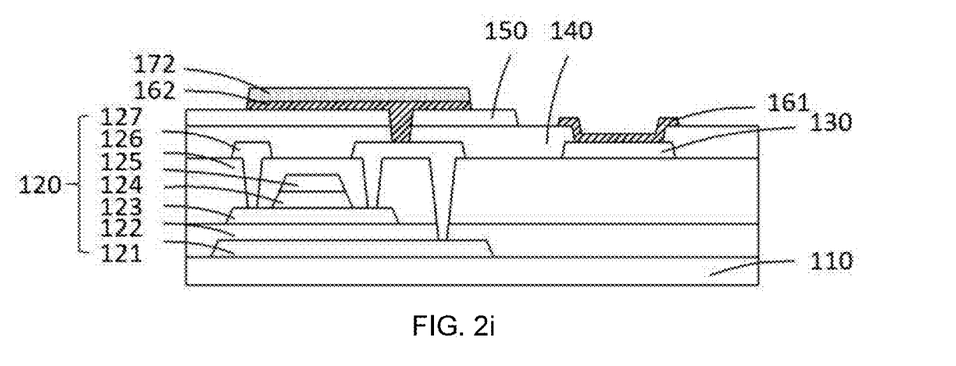

The first covering portion 161 is formed on the passivation layer 140 and electrically connected to the bonding terminal 130 through the first through hole H1, and the second covering portion 162 is formed on the planarization layer 150 and electrically connected to the drain electrode in the array driving layer 120 through the second through hole H2. In addition, the electrode layer 170 is further made to form a second electrode portion 172, and the second electrode portion 172 is correspondingly formed on the second covering portion 162. That is, a structure shown in FIG. 2i is formed. The first covering portion 161 covers the bonding terminal 130 for protection. The second covering portion 162 is electrically connected to the drain electrode as a bridging film electrically connected to upper film layers, so that the electrode layer 170 forms the second electrode portion 172 corresponding to the second covering portion 162. The second electrode portion 172 is a bottom electrode formed on the array driving layer 120 of the display area, and is generally used as an anode of an OLED device.

In the method for manufacturing the display panel in this embodiment, the covering layer with improved stability is formed on the bonding terminal, and the covering layer and the electrode layer thereon are patterned by a single exposure process by using half-tone mask technology, so as to form a corresponding covering portion to cover the bonding terminal to improve the reliability of the bonding terminal. Moreover, compared with the conventional technology, the method for manufacturing the display panel does not need to increase the quantity of photomasks, has the simple process and low costs, and is suitable for large-scale mass production.

In some embodiments, the step S50 specifically includes the following steps.

In a step S501, forming a photoresist layer on the electrode layer, and using the half-tone mask to expose and develop the photoresist layer, so that the photoresist layer is patterned to form a first photoresist portion 181 and a second photoresist portion 182. The first photoresist portion 181 is correspondingly disposed on the bonding terminal 130, and the second photoresist portion 182 is correspondingly disposed on the array driving layer 120, and a thickness of the first photoresist portion 181 is less than a thickness of the second photoresist portion 182. That is, a structure as shown in FIG. 2e is formed.

Besides, the specific manufacturing steps of patterning the photoresist layer include: coating a layer of photoresist material, exposing the photoresist material under shielding of the half-tone mask, and developing the exposed photoresist material. A photomask is a half-tone mask and includes two shielding portions with different light transmittances to form the first photoresist portion 181 and the second photoresist portion 182 with different thicknesses correspondingly.

In a step S502, under shielding of the first photoresist portion 181 and the second photoresist portion 182, the electrode layer 170 and the cover layer 160 are etched so that the electrode layer 170 forms a first electrode 171 corresponding to the first photoresist portion 181 and a second electrode 172 corresponding to the second photoresist portion 182, and the covering layer 160 forms a first covering portion 161 corresponding to the first photoresist portion 181 and a second covering portion 162 corresponding to the second photoresist portion 182. The first covering portion 161 is connected to the bonding terminal 130 through the first through hole H1, and the second covering portion 162 is correspondingly formed on the array driving layer 120 and the planarization layer 150. That is, a structure as shown in FIG. 2f is formed.

In a step S503, performing an ashing treatment on the first photoresist portion 181 and the second photoresist portion 182, so that the first photoresist portion 181 is completely removed, and the second photoresist portion 182 is thinned to form a third photoresist portion 183. That is, a structure as shown in FIG. 2g is formed. Besides, the photoresist layer is gradually thinned by an ashing process until the first photoresist portion 181 is exactly completely removed.

In a step S504, the first electrode portion 171 is etched and removed. That is, a structure as shown in FIG. 2h is formed.

In a step S505, the third photoresist portion 183 is peeled off. That is, a structure as shown in FIG. 2i is formed.

In some embodiments, referring to FIG. 2b, in the step S20, an orthographic projection of the first through hole H1 projected on the substrate 110 is within an orthographic projection of the bonding terminal 130 projected on the substrate 110. Therefore, the passivation layer 140 completely covers a side wall of the bonding terminal 130 to prevent the side wall of the bonding terminal 130 from being corroded due to exposure.

Furthermore, in some embodiments, referring to FIG. 2i, in the step S20, the first covering portion 161 covers a side wall of the first through hole and extends to the surface of the passivation layer 140. The first covering portion 161 completely covers an upper surface of the bonding terminal 130, and covers the bonding terminal 130 internally together with the passivation layer 140 to realize protection.

In some embodiments, in the step S30, the material of the covering layer is a conductive material with stable chemical properties, for example, it can be selected from molybdenum-titanium alloy or titanium, which are commonly used in this field.

In some embodiments, in the step S502, the specific step of etching the electrode layer and the covering layer includes: first, etching the electrode layer using a wet etching process, and then etching the covering layer using a dry etching process.

Figure 2J:
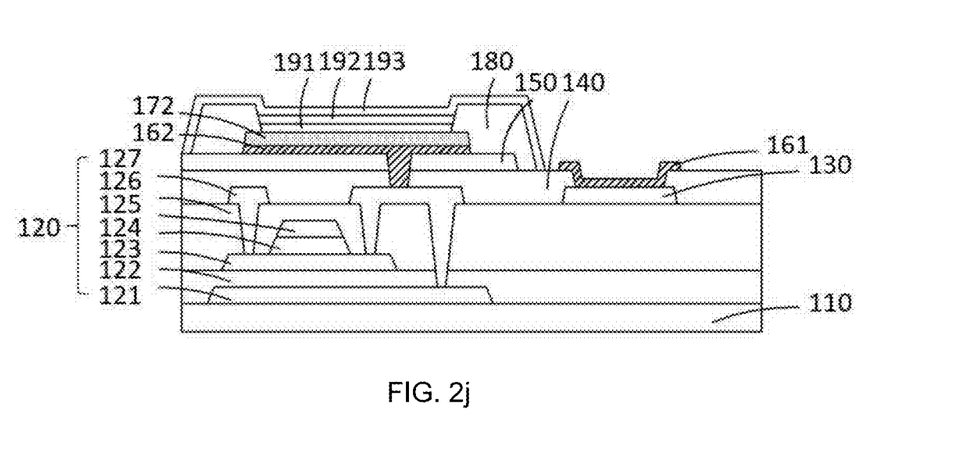

In some embodiments, after the step S50, the method further includes the step of sequentially forming a defining layer 180, a light emitting functional layer 191, a top electrode layer 192, and an encapsulation layer 193 on the second electrode portion 172.

The pixel definition layer 180 is formed with an opening so that the surface of the second electrode portion 172 is exposed.

The light emitting functional layer 191 is disposed in the opening and covers the second electrode portion 172. The light emitting functional layer 191 usually includes a hole injection layer, a hole transport layer, an organic light emitting layer, electron transport layer and electron injection layer.

The top electrode layer 192 is disposed on the light emitting function layer 191, so that the top electrode layer 192, the light emitting function layer 191, and the second electrode portion 172 form a light emitting device for display.

The encapsulation layer 193 is formed on the top electrode layer 192 and the pixel definition layer 180 in the display area A1. That is, a structure as shown in FIG. 2j is formed. The encapsulation layer 193 is made of inorganic materials such as silicon oxide, silicon nitride, aluminum oxide, etc. In other embodiments, the encapsulation layer 193 is a laminated structure in which an inorganic layer and an organic layer are alternately disposed, and a material of the organic layer may be at least one of acrylic, epoxy, and organic silicon.

It should be noted that only the above structures are described in the embodiment of the method for manufacturing the display panel. It can be understood that in addition to the above structures, other necessary structures can be formed in the display panel of the embodiment of the disclosure by processes commonly used in the art as required, which are not limited herein.

The disclosure further provides a display panel, which is manufactured by the method for manufacturing the display panel in the above-mentioned embodiments.

The display panel includes a display area A1 and a non-display area A2 adjacent to the display area A1. The display panel further includes a substrate 110, an array driving layer 120, a bonding terminal 130, a passivation layer 140, and a planarization layer 150, a covering layer 160 and an electrode layer 170.

The array driving layer 120 is disposed on the substrate 110 and disposed in the display area A1. The bonding terminal 130 is disposed on the substrate 110 and disposed in the non-display area A2. The passivation layer 140 is disposed on the array driving layer 120 and the bonding terminal 130. The passivation layer 140 includes a first through hole H1 to expose the bonding terminal 130. The planarization layer 150 is disposed on the passivation layer 140 and is disposed in the display area A1. The planarization layer 150 is disposed on the array driving layer 120. The covering layer 160 is disposed on the passivation layer 140 and the planarization layer 150, and the covering layer 160 includes a first covering portion 161 and a second covering portion 162. The first covering portion 161 is disposed on the passivation layer 140 and is connected to the bonding terminal 130 through the first through hole H1. The second covering portion 162 is disposed on the planarization layer 150 and is also disposed above the array driving layer 120. The electrode layer 170 is disposed on the covering layer 160, and the electrode layer 170 includes a second electrode portion 172 disposed on the second covering portion 162.

For other specific structures of the display panel, please refer to the above-mentioned embodiment, which will not be repeated herein. This disclosure further provides a display device, including the display panel described in the above-mentioned embodiments. The display device can be a smart phone, a tablet computer, a notebook computer, a digital camera, a digital video camera, an intelligent wearable device, a vehicle mounted display, a television, an e-book reader, etc.

In the above-mentioned embodiments, the description of each embodiment has its own emphasis. For a portion that is not described in detail in an embodiment, please refer to the detailed description of other embodiments above, which will not be repeated herein.

The above description describes a display panel provided by the embodiment of the disclosure and the method for manufacturing the display panel in detail. Specific examples are used in this specification to illustrate the principles and implementation of the disclosure. The description of the above embodiments is only used to help understand the method and main features of this disclosure. Meanwhile, for those skilled in the art, there will be changes in the specific embodiment and application according to the main features of this disclosure. In conclusion, the contents of the specification should not be understood as restrictions on the disclosure.

What is claimed is:

1. A display panel, comprising a display area and a non-display area adjacent to the display area;
   wherein the display panel further comprises:
   a substrate;
   an array driving layer disposed on the substrate and located in the display area;
   a bonding terminal disposed on the substrate and located in the non-display area;
   a passivation layer disposed on the array driving layer and the bonding terminal, wherein the passivation layer comprises a first through hole and a second through hole, the first through hole exposes the bonding terminal, and the second through hole exposes a part of the array driving layer;
   a covering layer disposed on the passivation layer, wherein a material of the covering layer comprises molybdenum titanium alloy or titanium and excludes Ag, the covering layer comprises a first covering portion and a second covering portion, the first covering portion is disposed on the passivation layer and connected to the bonding terminal through the first through hole, the second covering portion is connected to the array driving layer through the second through hole, and a height of the second covering portion is higher than a height of the first covering portion; and
   an electrode layer disposed on the covering layer, wherein the electrode layer comprises a second electrode portion disposed on the second covering portion, wherein the second electrode portion is attached to the second covering portion, and an orthographic projection of the second electrode portion projected on the substrate is fully within an orthographic projection of the second covering portion projected on the substrate.

2. The display panel according to claim 1, further comprising:
   a planarization layer disposed on the passivation layer, wherein the second through hole is electrically connected to the array driver layer through the planarization layer and the passivation layer;
   the array driver layer further comprising, in sequence, an active layer, a gate insulating layer, a gate layer, an interlayer insulating layer, and a source and drain electrode layer, wherein the second covering portion is electrically connected to the source and drain electrode layers through the second through-hole.

3. The display panel according to claim 2, wherein the source and drain electrode layers and the bonding terminal are disposed in a same layer.

4. The display panel according to claim 1, wherein a height of the second through hole is higher than a height of the first through hole.

5. A display panel, comprising a display area and a non-display area adjacent to the display area;
   wherein the display panel further comprises:
   a substrate;
   an array driving layer disposed on the substrate and located in the display area;
   a bonding terminal disposed on the substrate and located in the non-display area;
   a passivation layer disposed on the array driving layer and the bonding terminal, wherein the passivation layer comprises a first through hole to expose the binding bonding terminal;
   a covering layer disposed on the passivation layer, wherein a material of the covering layer comprises molybdenum titanium alloy or titanium and excludes Ag, the covering layer comprises a first covering portion and a second covering portion, the first covering portion is disposed on the passivation layer and connected to the bonding terminal through the first through hole, and the second covering portion is disposed on the array driving layer; and an electrode layer disposed on the covering layer, wherein the electrode layer comprises a second electrode portion disposed on the second covering portion, wherein the first covering portion on the bonding terminal, as well as the second covering portion and the second electrode portion on the array driving layer, are formed using a same photomask, wherein the second electrode portion is attached to the second covering portion, and an orthographic projection of the second electrode portion projected on the substrate is fully within an orthographic projection of the second covering portion projected on the substrate.

6. The display panel according to claim 5, wherein the passivation layer further comprises a second through hole, the second through hole exposes a part of the array driving layer, and the second covering portion is connected to the array driving layer through the second through hole.

7. The display panel according to claim 6, wherein a height of the second through hole is higher than a height of the first through hole.

8. The display panel according to claim 6, further comprising:

a planarization layer disposed on the passivation layer, wherein the second through hole is electrically connected to the array driver layer through the planarization layer and the passivation layer;

the array driver layer further comprising, in sequence, an active layer, a gate insulating layer, a gate layer, an interlayer insulating layer, and a source and drain electrode layer, wherein the second covering portion is electrically connected to the source and drain electrode layers through the second through-hole.

9. The display panel according to claim 8, wherein the source and drain electrode layers and the bonding terminal are disposed in a same layer.

* * * * *